United States Patent [19]

Blieden et al.

[11] 4,357,486

[45] Nov. 2, 1982

[54] LUMINESCENT SOLAR COLLECTOR

[75] Inventors: Harry R. Blieden, Los Angeles; John W. Yerkes, Granada Hills, both of Calif.

[73] Assignee: Atlantic Richfield Company, Los Angeles, Calif.

[21] Appl. No.: 887,110

[22] Filed: Mar. 16, 1978

[51] Int. Cl.³ .............................................. H01L 31/04
[52] U.S. Cl. .................................... 136/247; 136/259; 250/227
[58] Field of Search ............. 136/89 HY, 89 PC, 247, 136/259; 250/227

[56] References Cited

U.S. PATENT DOCUMENTS 3,484,606 12/1969 Masi ....................................... 250/71
3,591,420 7/1971 Streed .................................... 136/89
3,912,931 10/1975 Gravisse et al. ..................... 250/458
4,084,985 4/1978 Evans, Jr. .......................... 136/89 P

FOREIGN PATENT DOCUMENTS 2501907 7/1976 Fed. Rep. of Germany ... 136/89 PC

OTHER PUBLICATIONS

P. B. Mauer et al. "Fluorescent Concentrator for Solar Energy Collection", *Research Disclosure,* Jan. 1976, p. 20.

*Primary Examiner*—Aaron Weisstuch
*Attorney, Agent, or Firm*—Roderick W. MacDonald

[57] ABSTRACT

A photovoltaic device composed of a luminescent member having a plurality of large area sides connected by an edge face, and at least one photovoltaic means carried by at least one of said sides.

14 Claims, 13 Drawing Figures

LUMINESCENT SOLAR COLLECTOR

BACKGROUND OF THE INVENTION

It is well known that photovoltaic cells use specially prepared semiconductor junctions to convert energy from sunlight to electricity.

A problem with solar arrays is the difficulty and expense of making the semiconductor materials. The sun yields a certan amount of energy per square foot of the earth's surface, which for a given latitude and time of day and year is fixed; although it can be diminished to some degree by adverse weather conditions. Consequently, it is necessary to collect the sunlight on an area large enough to yield the desired amount of electricity since the efficiency of even the best semiconductor material in converting sunlight to electricity is limited.

One solution to this problem has been the use of light concentrating devices. Many forms of concentrators have been proposed and some are in use. Some concentrators depend on the use of a lens to focus the sunlight on a photovoltaic cell. Other concentrators use mirrors for the same purpose. By either of these approaches sunlight from a large area can be collected and converted by one or more cells having a much smaller area. The ratios run from 5-1 to as much as 1000-1 in some cases. This approach then is based upon the idea that it is cheaper to cover a substantial portion of the earth's surface with mirrors or lenses than with photovoltaic cells. One undesirable feature of such concentrators is that they require a mechanism to point the apparatus accurately at the sun. This in turn involves the use of moving parts, a sensing system or other form of control. Furthermore, on cloudy days this type of concentrator may be of little use because while there may be considerable light it is diffuse and cannot be readily focused.

It is also well known that a specific photovoltaic semiconductor junction utilizes, for conversion to electricity, only a portion of the spectrum of energy available in sunlight. For example, the conversion of sunlight to electrical energy using well known silicon photovoltaic cells is strongly dependent upon the conversion of light with energy at or above 1.1 electron volts while most of the lower energy light also present is either transmitted through the cell or converted to heat instead of electricity. The heat generated can reduce the efficiency of the silicon cell for the conversion of the higher energy light to electricity.

Some of the sunlight which penetrates the light transmitting member of a conventional nonconcentrating photovoltaic array is lost such as by passing through an interstice between adjacent photovoltaic cells, reflection back out of the member, and the like.

Accordingly, current photovoltaic arrays receive more energy input from sunlight than they retain for conversion into electrical output and it is highly desirable to increase the amount of sunlight an array retains for such conversion.

One known approach for increasing the capacity of photovoltaic arrays to convert sunlight energy to electricity is to employ one or more luminescent agents such as dyes, pigments, metal oxides, and the like in the light transmitting member, which agents, when exposed to sunlight, take in light from one direction and emit lower energy light in numerous directions. An example of such an agent is organic dyes such as the dyes heretofore employed in the scintillation counters, lasers, and the like.

The light falling on the flat surface of a light transmitting member which contains such dyes is absorbed by the dye and re-emitted in an isotropic configuration. In effect, this shifts the wave length of the light to a lower energy and at the same time directs most of the light toward the edge face of the member and, therefore, the edge faces appear quite bright. Thus, the prior art has heretofore required that photovoltaic cells be mounted on the edge faces in order to pick the light up. Since light transmitting members are usually relatively thin sheets, the edge faces of such sheets generally cover a much smaller area than their flat large area sides and the result is a light concentrator.

The particular luminescent agent or agents employed in conjunction with an array of specific photovoltaic cells are chosen, inter alia, for their ability to emit light in an energy level range which suits the conversion characteristics of that cell. This way, a portion of the light that would otherwise be lost for electrical generation, e.g., lost by transmission, reflection, and the like, is transformed by the luminescent agent into multidirectional light that is more readily retained in the light transmitting member by internal reflection, thereby increasing the efficiency of the array.

A photovoltaic array which employs this approach is hereinafter referred to as a luminescent photovoltaic array. Such an array usually employs fluorescent dyes, fluorescence being that species of luminescence wherein the emitted light is usually in the visible spectrum. However, other species of luminescence exist. Phosphoresence (light emission continues after the stimulating light has stopped) is one such species.

It should be understood that this invention covers all species of luminescence, as well as all types of luminescent agents.

Heretofore the prior art has required the photovoltaic cell or cells employed to be mounted on the thin edge face or faces of the light transmitting luminescent member as opposed to its large area sides because internally reflected light tends to concentrate at their edges. However, edge face mounting can be a problem because it is physically difficult to mount photovoltaic cells on the edge of a sheet. Prior art techniques favor the mounting of cells on large flat surfaces. The attendant wires, encapsulation, etc., that go with an array also are not compatible with the use of the edge of a sheet unless the sheet is very thick. A thick sheet, however, is expensive, which in turn obviates much of the benefit of the use of a concentrator.

When using a scintillator to detect a specific particle, the scintillator is excited when the particle in question passes through it and emits light which is guided to a photomultiplier. Since the goal is to pick out a particular particle, the timing as to when excitation occurs and light is emitted is very important. A sharper time pulse can be obtained by recovering the light pulse from an edge of the scintillator. A sharp time pulse cannot be recovered from a large area side of the scintillator. Thus, all such scintillators (collimators) use edge recovery.

In this invention timing of light pulses is not as important as collecting and keeping (concentrating) all the light possible for recovery at the photovoltaic cells. Thus, recovery from a large area side, contrary to timing scintillators, is more desirable.

SUMMARY OF THE INVENTION

According to this invention there is provided a luminescent photovoltaic device comprising a light transmitting luminescent member which has at least one pair of opposed essentially parallel large area sides connected by a plurality of thin edges faces, (collectively referred to as an edge face) and, contrary to the prior art, at least one photovoltaic means carried by at least one of said large area sides rather than on its edge face.

Accordingly, it is an object of this invention to provide a new and improved luminescent photovoltaic device. It is another object to provide a new and improved photovoltaic device based on an optimum combination of current photovoltaic technology and luminescent technology.

Other aspects, objects and advantages of this invention will be apparent to those skilled in the art from this disclosure and the appended claims.

DETAILED DESCRIPTION OF THE INVENTION

Figure 1:
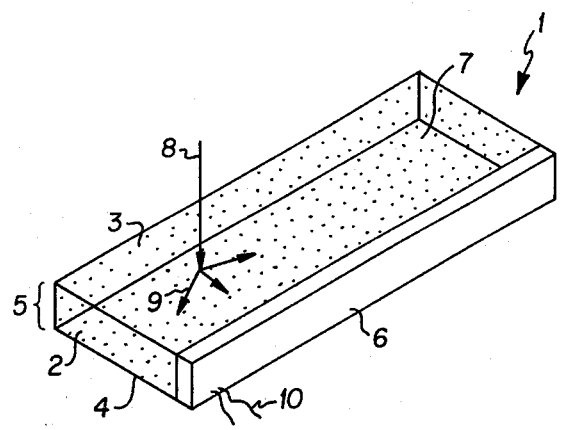
FIG. 1 shows a prior art luminescent-photovoltaic device.
Figure 2:
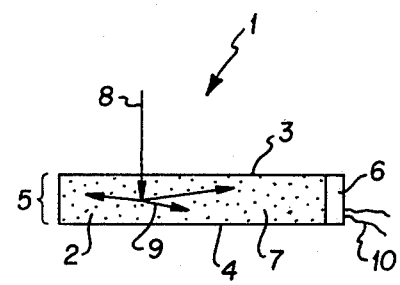
FIG. 2 shows a cross-section of the device of FIG. 1.

More specifically, FIG. 1 shows a prior art luminescent-photovoltaic device 1 composed of a planar sheet which is a light transmitting luminescent member 2 that has parallel and opposed large surface area sides 3 and 4 joined by thin upstanding edge face 5. A portion of edge face 5 carries a photovoltaic cell 6.

Luminescent member 2 is composed of a matrix material which contains dispersed throughout one or more luminescing agents as represented by dots 7. Dots 7 are employed for clarity sake, but in actuality the luminescing agent or agents normally are not visible as discrete dots.

A device such as that shown in FIG. 1 is fully and completely disclosed in Applied Optics, Volume 15, No. 10, Pages 2299 and 2300, October, 1976, the disclosure of which is incorporated herein by reference.

In accordance with device 1, a ray of sunlight approaching side 3 as shown by arrow 8 passes into the interior of luminescent member 2 and strikes a luminescent agent which emits some light 9 in the direction of cell 6. Upon impact of subrays 9 with photovoltaic cell 6, part of the energy carried by those subrays is converted into electricity which is then removed by way of electrical wires 10.

A difficulty with the device of FIG. 1 is that luminescent member 2 has to be made quite thick in order to attach a conventional photovoltaic cell to its edge face 5. Another difficulty is that for a large area luminescent member 2, i.e., large area sides 3 and 4, subrays 9 would have to pass through so much of member 2 in order to reach edge face photovoltaic cell 6 that a substantial part of such light would be absorbed before it reached cell 6. Thus, by this invention the edge face can be made very thin and this helps in minimizing the amount of material which light such as subrays 9 has to pass through in order to reach a photovoltaic cell.

Figure 3:
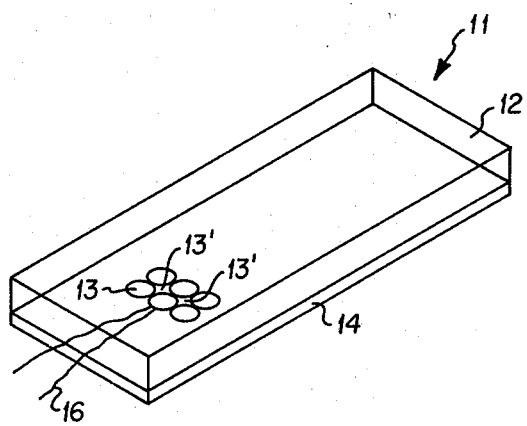
FIG. 3 shows a prior art photovoltaic device.

FIG. 3 shows a conventional superstrate prior art photovoltaic array 11 which does not employ any luminescent enhancing. Device 11 is composed of an upper light transmitting member 12 of transparent material which can either be polymeric or glass or the like and which carries on its underside a plurality of photovoltaic cells 13, the photovoltaic cells having a moisture barrier layer 14 thereunder which can be composed of the same transparent polymeric material or glass as member 12 or other material as desired. Cells 13 are packed close to one another but open interstices 13' between adjacent cells are present. Thus, an incident ray of sunlight 15 entering device 11 directly over cell 13 will impact that cell and a part of its energy converted to electricity which is then removed by way of wires 16. To maximize the reception of direct rays such as ray 15, prior art photovoltaic devices employ a tracking device which causes the device to follow the sun during the day.

Figure 4:
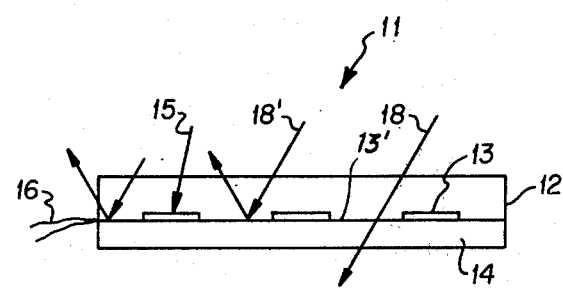
FIG. 4 shows a cross-section of the device of FIG. 3.

As can be seen from FIG. 4, a ray of sunlight entering device 11 by way of path 18 could pass through an interstice 13', miss all cells 13, and be lost. Similarly, ray 18' could be back reflected from the cell side of member 12 and out of member 12.

Figure 5:
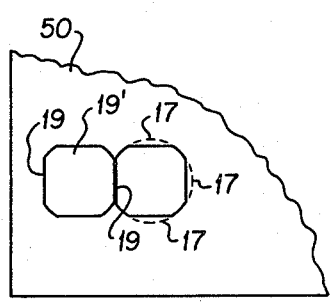
FIG. 5 shows a sample of prior art packing of photovoltaic cells in a device such as that shown in FIG. 3.

Photovoltaic cells are, due to the process by which they are manufactured, normally round in their initial configuration. The prior art has removed hemispherical sections 17, FIG. 5, in order to make straight sides 19 on photovoltaic cells 19'. This way, cells 19' can be packed even closer together under light transmitting member 50 thereby minimizing the amount of lost sunlight such as that represented by ray 18 of FIG. 4. However, some light is still lost through such interstices. If the interstices are darkened, detrimental heat is generated in the darkened areas. What is desired is reflection from the interstices without back reflection loss such as shown for ray 18' of FIG. 4.

According to this invention photovoltaic cells are, contrary to the teachings of the prior art, carried by (on the surface of or embedded in) at least one of the large surface area sides of the light transmitting luminescent member.

Although not required in the broadest scope of this invention, the array assembly can have its interstices and/or edge face covered with a reflective and/or diffusive member as will be discussed in greater detail hereinafter.

When an array according to this invention is employed, the photovoltaic cells need not be closely packed as is necessary with a standard nonluminescent photovoltaic device such as that shown in FIG. 3.

Thus, by this invention loss of light is minimized, and close packing of the photovoltaic cells can be eliminated if desired. Further, the luminescent photovoltaic device of this invention requires no tracking equipment, requires no change in the normally round shape of the photovoltaic cells, and can be made as thin as desirable, i.e., much thinner than the prior art of FIG. 1 could tolerate. The photovoltaic cells employed in this invention can be any desired shape or shapes and can be arranged in any desired pattern. Photovoltaic cells can even be emplaced on top of the device as well as on the bottom, i.e., carried by more than one of the large area sides of the device. For example, cells could be carried on upper side in areas that would normally be shaded by a structural member such as a holding clamp, etc.

Figure 6:
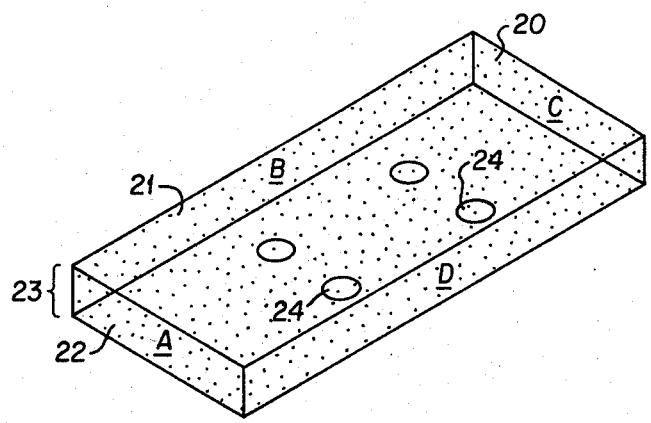
FIG. 6 shows a device in accordance with this invention.

FIG. 6 shows a luminescent array in accordance with this invention. No cell close packing or diffusive or reflective member is employed in this broadest aspect.

FIG. 6 shows a light transmitting luminescent member 20 having a pair of opposed, essentially parallel, large area sides 21 and 22, sides 21 and 22 being joined by a thin upstanding edge face 23 (composed of faces A through D) which has a substantially smaller area than sides 21 or 22. Luminescent member 20 carries on its large area underside 22 a plurality of photovoltaic cells 24. No photovoltaic cells are necessary on edge face 23 although their exclusion also is not required if a sufficiently thin cell can be found. Member 20, i.e., sides 21 and 22, can cover as large an area as desired without concern for undue light absorption by member 20 before it reaches a cell as was previously noted for the subrays 9 in the edge face photovoltaic device of FIG. 1.

Figure 7:
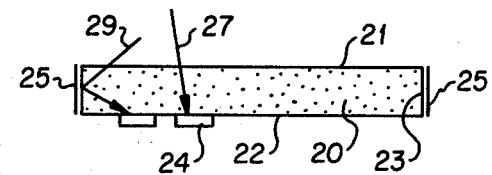
FIG. 7 shows a cross-section of the device of FIG. 6 together with a reflective member.

Referring to FIG. 7, a reflective member 25, e.g., a mirror or metal foil or the like, is emplaced on all or part of edge face 23. Surface 21 is kept smooth and polished for internal reflection purposes so that not only will direct sunlight rays such as 27 be received by the photovoltaic cells and converted to electricity, but also angularly incident rays such as ray 29 reflected off mirror 25 are internally reflected until they reach photovoltaic cells 24.

The array of this invention is such that light inside member 20 preferentially leaves member 20 through the side or sides which carry the photovoltaic cells. The array of this invention is a light concentrator and a heat dissipater (i.e., heat nonconcentrator) because any heat generated is spread out throughout the large area member 20 and not concentrated at the cells like the light is. Accordingly, the interface between member 20 and cells 24 should be carefully constructed so as to encourage light to leave member 20 at that interface. Many approaches are available for such encouragement. For example, there should be essentially no air gap between member 20 and cells 24. If there is any material between member 20 and cells 24 it should be optically clear and have an index of refraction close to the index of refraction of member 20. The interface could even carry an antireflective coating, antireflective materials being known in the art for use on the top surface of a conventional array of FIG. 3 to encourage light to enter member 12. Further that part of member 20 which is adjacent such interface can be physically modified to encourage light escape at the interface such as by roughening bottom side 22 of member 20 at such interface, embedding the cell in the member as shown for cell 41' in FIG. 9, and the like. If glue is used in the interface it should also be chosen for its optical properties which encourage light escape at the interface.

By following this invention a large working area, e.g., large area side 22 in FIG. 6, is provided for optimization such as variations in cell size, configuration, arrangement, and the like. Also, since the total light flux on the cells is independent of the thickness of member 20, and the thickness of such a member is not constrained by the state of the cell art as it is in the prior art device of FIG. 1, the light transmitting member of this invention can vary as widely as desired. For example, as will be shown in more detail hereinafter, such member can vary from a very thin, flexible film to a thick structural supporting member without sacrifice in the other advantages of this invention.

Figure 8:
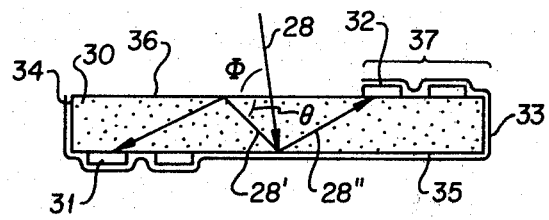
FIG. 8 shows a cross-section of another device within the scope of this invention.

FIG. 8 shows an embodiment within this invention wherein luminescent member 30 has photovoltaic cells 31 on the bottom large area side thereof and additional photovoltaic cells 32 on part of upper large area side 36. Diffuser 33 covers not only edge face 34 and bottom side 35 (including the interstices between adjacent cells) but also the portion of upper side 36 which carries cells 32, i.e., portion 37. Portion 37 of diffuser 33 could be omitted, thereby leaving interstices on side 36 for the admission of incident sunlight between cells 32. Diffuser 33 can also serve as a moisture barrier in lieu of layer 24 of prior art FIG. 3.

If bottom surface 35 was mirrored, ray 28 could simply be reflected back out of the device through side 36 as shown for ray 18' of FIG. 4. However, diffuser 33 breaks up incident light into subrays of various angles of travel so that the subrays hit side 36 at an angle $\theta$ which is different from the angle $\phi$ at which the incident light ray 28 initially penetrated side 36. Accordingly, this diffusion mechanism enhances the internal reflection and retention of light energy which reaches the interior of member 30. This is shown in FIG. 8 wherein incident ray 28 is broken up into two subrays 28' and 28'' (in actuality an extremely large number of subrays will be formed). Subray 28' reflects back towards side 35 at an angle $\theta$ which is different from the original angle of incidence $\phi$ of ray 28 thereby enhancing the likelihood that subray 28' will be internally reflected from the smooth surface of side 36 back to cells 31 for the generation of electricity. Diffuser 33 could cover only cell interstices or only the edge face or a combination thereof.

Figure 9:
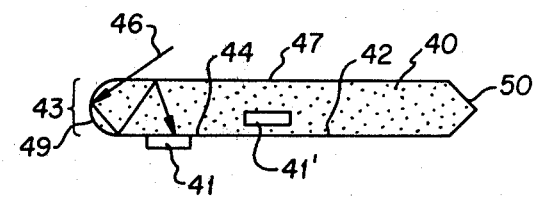
FIG. 9 shows another device within this invention.

FIG. 9 shows a luminescent member 40 having photovoltaic means 41 (cell 41' being embedded in member 40) on bottom side 42 and a curved reflective surface 49 for edge face 43. A light ray 46 in prior art arrays could enter side 47 and be lost through a straight edge face such as face 5 of FIG. 1, but in this embodiment ray 46 is instead internally reflected off reflectively contoured surface 49 and then further internally reflected until it strikes a cell 41. Other reflective edge configurations can be employed, for example beveled edge 50.

Figure 10:
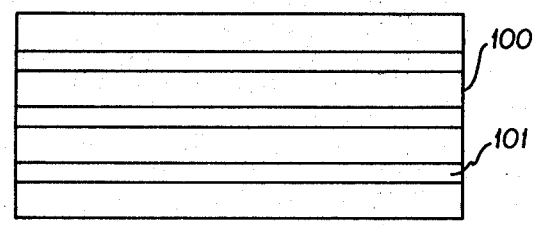
FIGS. 10 and 11 show another embodiment within this invention.

FIG. 10 shows a rectangular light transmitting luminescent member 100 which has long, narrow photovoltaic cells 101 mounted thereon for the full length, or at least most of the length, of member 100.

Figure 11:

FIG. 11 shows a side view of the device of FIG. 10 and further shows that both members 100 and 101 are quite thin. For example, member 100 could be a plastic film about 1/64 inch (approx. 0.4 mm) thick while cell strip 101 could be about 10 mils thick. Member 100 is totally internally reflective of a major portion of luminescent radiation emitted within member 100.

Figure 12:
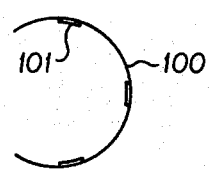
FIGS. 12 and 13 show ways of folding the device of FIGS. 10 and 11.

FIG. 12 shows that the device of FIG. 10 could be rolled in a circle for storage, transportation, etc.

Figure 13:
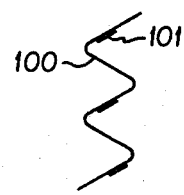

FIG. 13 shows that the device of FIG. 11 could be folded accordion fashion for storage, etc.

The luminescent art is well known, the observation that some materials emit visible radiation when exposed to sunlight being traceable back over four hundred years. One of the first, if not the first, scintillation material to be synthesized (2,5-diphenyloxazole) was prepared in 1896. Scintillation devices and lasers are in the luminescence area and have received extensive study in recent times. Thus, to one skilled in the art, luminescent agents are well known and can be readily chosen once the operational parameters are set. For this invention it is only required that one or more luminescent agents be employed which, upon receiving sunlight emit light of different energy levels in numerous directions, the emission energy levels at least approaching the energy range in which the one or more photovoltaic cells carried by the device of this invention more efficiently convert light energy to electricity. This definition of luminescent agent includes the cascading approach where one luminescent agent receives sunlight, emits light in a different energy range and another different luminescent agent is present which receives this emitted light and then re-emits yet other light, which light can then either be absorbed by a photovoltaic cell or yet again absorbed by yet another luminescent agent for further re-emission, and so on. Thus, the amount and types of luminescent agent or agents employed will vary widely depending upon, for example, the particular photovoltaic cell or cells employed, the particular use to which the array is to be put, and the like so that it is impossible to quantify all possible amounts and types of such agents other than functionally as set forth above. However, once the above functional parameters are set forth, one skilled in the art can choose the appropriate luminescent agent or agents, the amounts thereof, and the matrix material.

The light transmitting luminescent member matrix material can be a polymeric material which is transparent at least to the visible light spectrum. Such material can therefore be a conventional plastic polymeric material such as polymethylmethacrylate, other known acrylic polymers, styrene polymers, and the like. The material can also be a glass or other transparent materal into which luminescent agents can be incorporated and which, like the polymeric material, are nondeleterious to such agents and to the photovoltaic cells, and which can be formed into a structural shape. The matrix material can by any light transmitting material heretofore used to cover conventional nonluminescent photovoltaic devices.

The luminescent agents can include metals or oxides or other compounds of the metals such as neodymium oxide employed in a glass matrix, or one or more laser dyes such as the coumarin family of dyes and the rhodamine family of dyes. These dyes are very complex chemically, e.g., coumarin 102 is 2,3,5,6-1H,4H-tetrahydro-8- -methylquinolazin-[9,9a-1-gh] coumarin, and rhodamine 110 is o-(6-amino-3-imino-3H-xanthen-9-yl) benzoic acid hydrochloride, but these materials and the characteristics thereof are well known in the art and are commercially available so that further detailed description is unnecessary to inform one skilled in the art.

The luminescent agent is simply dispersed in the matrix material by mixing or other dispersion while the matrix material is in a fluid state due to heating and the like. After the mixing process, the luminescent material is cast or otherwise shaped into the desired structural configuration for the luminescent member. After such shaping the member is ready for the attachment of the photovoltaic cell or cells thereto.

Photovoltaic cells are also well known in the art and vary widely as to their characteristics. For example, cells based on germanium, silicon, indium phosphide, gallium aresnide, cadmium telluride, aluminum antimonide, cupric oxide, selenium, gallium phosphide, cadmium sulfide, combinations thereof, and the like can be employed in this invention. The particular luminescent agent or agents employed must emit light, either directly or by way of cascading, which at least approaches the energy range at which the photovoltaic cells employed most efficiently convert light energy to electricity. The preparation of and characteristics of photovoltaic cells are well known in the semiconductor art and therefore further detailed description is unnecessary to inform one skilled in the art.

The photovoltaic cells can be attached to the light absorbing member in any conventional manner such as gluing with glue, silicone, polyvinylbutyrate, etc., physical holding in place with the moisture barrier, and the like.

The photovoltaic cells employed in this invention can be of any size, shape, or configuration desired and can be randomly placed on the luminescent member without undue concern for interstices between adjacent cells. The cells could even be arranged for aesthetic purposes since luminescent devices work well with diffuse light and therefore need not be limited to direct sunlight rooftop installations.

Diffusive members can be made from any material which efficiently diffuses or otherwise breaks visible light in subrays. This includes most any type of rough surfaced reflective material. For example, crinkled, or otherwise uneven surfaced metal foil such as silver foil, tin foil, and the like, can be used. Essentially any paint produces a statisfactorily rough surface. Roughened or uneven anodized aluminum surfaces or rough mirrored surfaces, and the like, can be used. Colored polymeric film can also be used. To maximize the internal reflection and retention of light once it enters the interior of the luminescent member, the diffusive materials are preferably employed over a number of surfaces of the luminescent member which are not necessary for the admission of light into the member in the first place and which are not already covered by a photovoltaic cell or a reflective member. The goal is that once a ray of light enters the interior of the luminescent member, its opportunity for internal reflection until it reaches a photovoltaic cell is maximized. The surface which is left uncovered for the initial admission of light to the interior of the luminescent member is preferably kept polished, smooth, and clean to enhance internal reflection of light subrays therefrom before they reach a photovoltaic cell.

EXAMPLE I

A planar light transmitting luminescent member composed of polymethylmethacrylate is prepared having dispersed therein about $5 \times 10^{-4}$ weight percent based on the total weight of the member of each of courmarin 102 and rhodamine 110 and having an edge face height of about $\frac{1}{8}$ inch and a large side surface area of each side of about 10 inches by 10 inches. Then, commercial, 3 inch diameter, round p-n junction silicon photovoltaic cells are fixed to one side of the member in close cells are fixed to one side of the member in close packed relation as shown in FIG. 6 by gluing with silicone and wired together in parallel leaving two wires external to the device for removal of electricity.

EXAMPLE II

The array of Example I has its entire edge face covered with a reflective mirror member.

The array of this Example, even when out of direct sunlight will generate electricity from the diffuse light that does reach it.

Reasonable variations and modifications are possible within the scope of this disclosure without departing from the spirit and scope of this invention.

The embodiments of the invention in which an exclusive property or privilege is claimed are defined as follows:

1. A photovoltaic array comprising a luminescent member having at least one pair of opposed essentially parallel sides, each of said sides extending over a large area and being joined by a thin edge face, the area of said large area sides being substantially greater than the area of said edge face, at least part of said edge face being contoured so as to have an internally reflective configuration, and at least one photovoltaic means carried by and interfacing with at least one of said large area sides.

2. A photovoltaic array comprising a luminescent member having at least one pair of opposed essentially parallel sides, each of said sides extending over a large area and being joined by a thin edge face, the area of said large area sides being sustantially greater than the area of said edge face, and a plurality of photovoltaic means carried by and interfacing with both sides of said at least one pair of large area sides.

3. A device according to claim 2 wherein interstices are left between adjacent photovoltaic cells, a portion of said cells being on one large area side of said luminescent member, and the remainder of said cells being on the other side of said at least one pair of large area sides of said member.

4. A device according to claim 3 wherein a diffusive material also covers at least part of said interstices.

5. A device according to claim 4 wherein said diffusive material is paint.

6. A device according to claim 4 wherein said diffusive material is colored polymeric film.

7. A device according to claim 2 wherein said luminescent member comprises a polymer matrix and a luminescent agent comprising at least one organic dye.

8. A device according to claim 2 wherein at least part of said edge face is contoured so as to have an internally reflective configuration.

9. A device according to claim 2 wherein at least part of said edge face is internally reflective.

10. A photovoltaic array comprising a luminescent member having at least one pair of opposed essentially parallel sides, each of said sides extending over a large area and being joined by a thin edge face, the area of said large area sides being substantially greater than the area of said edge face, said luminescent member being thin and film-like and carrying spaced, elongated narrow photovoltaic strips on and interfacing with at least one of said large area sides.

11. A photovoltaic array comprising a luminescent member having at least one pair of opposed essentially parallel sides, each of said sides extending over a large area and being joined by a thin edge face, the area of said large area sides being substantially greater than the area of said edge face, at least one photovoltaic means carried by and interfacing with at least one of said large area sides, and at least one photovoltaic means embedded in said luminescent member.

12. A photovoltaic array comprising a luminescent member having at least one pair of opposed essentially parallel sides, each of said sides extending over a large area and being joined by a thin edge face, the area of said large area sides being substantially greater than the area of said edge face, at least one photovoltaic means carried by and interfacing with at least one of said large area sides, and said luminescent member is roughened in said interface.

13. A photovoltaic array comprising a luminescent member having at least one pair of opposed essentially parallel sides, each of said sides extending over a large area and being joined by a thin edge face, the area of said large area sides being substantially greater than the area of said edge face, at least one photovoltaic means carried by and interfacing with at least one of said large area sides, and there is an antireflective material in said interface.

14. A luminescent solar collector and concentrator comprising a thin sheet about 0.4 millimeters thick forming a radiation collection medium for receiving incident solar radiation having two parallel confronting smooth faces of extended area which are separated from each other by substantially smaller area edge faces, said medium containing at least one luminescent species capable of emitting luminescent radiation upon excitation with incident solar radiation, said medium being totally internally reflective of a major portion of said emitted luminescent radiation; and at least one photovoltaic cell physically bonded to, and optically coupled to, one of said faces in a relatively small part of the extended area thereof.

* * * * *